United States Patent
Hayzen et al.

(10) Patent No.: US 11,342,932 B2
(45) Date of Patent: May 24, 2022

(54) MACHINE SPECTRAL DATA COMPRESSION

(71) Applicant: Computational Systems, Inc., Knoxville, TN (US)

(72) Inventors: Anthony J. Hayzen, Knoxville, TN (US); Stewart V. Bowers, III, Knoxville, TN (US)

(73) Assignee: Computational Systems, Inc., Knoxville, TN (US)

( * ) Notice: Subject to any disclaimer, the term of this patent is extended or adjusted under 35 U.S.C. 154(b) by 38 days.

(21) Appl. No.: 15/931,198

(22) Filed: May 13, 2020

(65) Prior Publication Data

US 2021/0359702 A1 Nov. 18, 2021

(51) Int. Cl.
*H03M 7/30* (2006.01)
*G01M 7/02* (2006.01)

(52) U.S. Cl.
CPC ............ *H03M 7/30* (2013.01); *G01M 7/025* (2013.01)

(58) Field of Classification Search
None
See application file for complete search history.

(56) References Cited

U.S. PATENT DOCUMENTS

| | | | | |
|---|---|---|---|---|
| 5,739,698 A * | 4/1998 | Bowers | ................... | G01R 23/20 324/765.01 |
| 6,026,418 A * | 2/2000 | Duncan, Jr. | ............. | G06F 17/10 324/76.21 |
| 6,507,804 B1* | 1/2003 | Hala | ...................... | G01H 1/003 702/182 |
| 2001/0038715 A1* | 11/2001 | Emoto | .................... | H03M 7/30 382/232 |
| 2009/0019128 A1* | 1/2009 | Monro | .................... | H03M 7/30 709/207 |
| 2010/0262401 A1* | 10/2010 | Pfeifer | .................. | F04D 27/001 702/182 |
| 2015/0369699 A1* | 12/2015 | Chen | ................... | G01M 13/028 73/593 |

OTHER PUBLICATIONS

Aherwar, A. 2012, "An investigation on gearbox fault detection using vibration analysis techniques: A review", Australian Journal of Mechanical Engineering, vol. 10, No. 2. (Year: 2012).*

* cited by examiner

*Primary Examiner* — Matthew G Marini
(74) *Attorney, Agent, or Firm* — Luedeka Neely Group, P.C.

(57) ABSTRACT

A data compression process reduces the amount of machine spectral data transmitted over a network while maintaining the details of spectral peaks used for machine health analysis. The data compression process also provides for the calculation of various types of spectral parameters, such as spectral band parameters, with negligible loss of accuracy.

18 Claims, 8 Drawing Sheets

MACHINE SPECTRAL DATA COMPRESSION

FIELD

This invention relates to the transmission of data over a network. More particularly, this invention relates to a system for compressing machine spectral data for transmission over a network.

BACKGROUND

An issue often encountered with machine monitoring devices that continuously monitor machine health, such as in a manufacturing facility, is the bandwidth needed for transmission of machine health data over a network. This is particularly relevant to vibration spectral data that generally comprise large numbers of scalar values for each vibration spectrum, such as 3200, 6400, 12800, or more data points per spectrum. In addition to the large number of data points per spectrum, many facilities have installed large numbers of wireless vibration monitoring devices (>1000), each of which further adds to the high network bandwidth loads. In some facilities, the problem is further exacerbated by the relatively slow speed of the various types of networks, such as HART and Foundation Fieldbus, among others.

The bandwidth problem is not limited to the transmission of data over a network from the individual vibration monitoring devices to a data storage device on a server. The problem is also encountered on the local network between the server and the personal computers of vibration analysts. In large manufacturing facilities, there are typically numerous PC's connected to the server, each requiring large amounts of spectral data to be transmitted simultaneously, particularly when spectra are viewed in a live continuous mode.

What is needed, therefore, is a technique to compress any type of spectral machine data (standard vibration, PeakVue, Periodicity, etc.) to reduce the amount of data transmitted over a network with very limited loss of information.

SUMMARY

The above and other needs are met by a data compression process that reduces the amount of machine spectral data transmitted over a network while maintaining the details of spectral peaks used for analysis. In addition, the data compression process described herein provides for the calculation of various types of spectral parameters, such as spectral band parameters, with negligible loss of accuracy.

In one aspect, embodiments described herein are directed to a computer-implemented process for reducing the amount of machine spectral data to be transmitted over a communication network while maintaining details of spectral peaks used for analysis of the machine spectral data. A preferred embodiment of the process includes the following steps:

(a) sensing an operational characteristic of a machine and generating an operational characteristic signal using a sensor attached to the machine;

(b) generating machine spectral data based on the operational characteristic signal, where in the machine spectral data includes amplitude values and associated frequency values indicative of the operational characteristic of the machine;

(c) identifying N number of spectral peaks in the machine spectral data having amplitude values that are greater than the amplitude values of all spectral peaks not included in the N number of identified spectral peaks;

(d) storing a compressed spectral data set that includes N number of amplitude values and N number of frequency values associated with the N number of spectral peaks identified in step (c); and (e) transferring the compressed spectral data set over the communication network.

In some embodiments, the process includes:

calculating a first RMS value indicative of a root mean square of all amplitude values in the machine spectral data having associated frequency values that are less than a frequency value of a lowest-frequency peak of the N number of identified spectral peaks;

calculating N-1 number of second RMS values that are each indicative of a root mean square of amplitude values in the machine spectral data having associated frequency values falling between the frequency values associated with the N number of identified spectral peaks;

calculating a third RMS value indicative of a root mean square of all amplitude values in the machine spectral data having associated frequency values that are greater than a frequency value of a highest-frequency peak of the N number of identified spectral peaks; and step (d) includes storing the compressed spectral data set including the first RMS value, the second RMS values, and third RMS value.

In some embodiments, the process includes calculating spectral band energy from the compressed spectral data set.

In some embodiments, step (d) includes storing the compressed spectral data set including a value indicating a maximum spectral frequency (Fmax) of the machine spectral data, a value indicating a number of lines of resolution of the machine spectral data, and a value indicating a frequency step size (bin width) between lines of resolution in the machine spectral data.

In some embodiments, the process includes:

identifying spectral side values associated with each of the N number of identified spectral peaks, wherein the spectral side values comprise amplitude values that are adjacent in frequency to the frequency values associated with each of the N number of identified spectral peaks; and step (d) includes storing the compressed spectral data set including the spectral side values.

In embodiments that include identifying spectral side values, the process includes:

calculating a first RMS value indicative of a root mean square of all amplitude values in the machine spectral data having associated frequency values that are less than a frequency value of a lowest-frequency peak of the N number of identified spectral peaks, excluding the spectral side values;

calculating N-1 number of second RMS values, each indicative of a root mean square of amplitude values in the machine spectral data having associated frequency values falling between the frequency values associated with the N number of identified spectral peaks, excluding the spectral side values;

calculating a third RMS value indicative of a root mean square of all amplitude values in the machine spectral data having associated frequency values that are greater than a frequency value of a highest-frequency peak of the N number of identified spectral peaks, excluding the spectral side values; and step (d) includes storing the compressed spectral data set including the first RMS value, the second RMS values, and third RMS value.

In some embodiments, the sensor is a vibration sensor, the operational characteristic signal is a vibration signal, and the machine spectral data is a vibration spectrum.

In some embodiments, step (e) includes transferring the compressed spectral data set from a machine health data collector to a server computer or transferring the compressed spectral data set from the server computer to a machine health analysis computer.

In some embodiments, the process includes reconstructing the machine spectral data from the compressed spectral data set for plotting on a display device.

In another aspect, embodiments described herein are directed to an apparatus for reducing an amount of machine vibration spectral data to be transmitted over a communication network while maintaining details of spectral peaks used for analysis of the machine vibration spectral data. In a preferred embodiment, the apparatus includes a vibration sensor, a vibration monitoring device, a processor, and a communication network. The vibration sensor senses vibration of a machine and generates a vibration signal. The vibration monitoring device receives the vibration signal and generates vibration spectral data based thereon. The vibration spectral data includes amplitude values and associated frequency values indicative of the vibration of the machine. The processor identifies N number of spectral peaks in the vibration spectral data having amplitude values that are greater than the amplitude values of all spectral peaks not included in the N number of identified spectral peaks. The processor generates a compressed vibration spectrum comprising N number of amplitude values and N number of frequency values associated with the N number of spectral peaks. The communication network transfers the compressed vibration spectrum to a remote storage device or a machine health analysis computer.

In some embodiments, the processor:
 calculates a first RMS value indicative of a root mean square of all amplitude values in the vibration spectral data having associated frequency values that are less than a frequency value of a lowest-frequency peak of the N number of identified spectral peaks;
 calculates N-1 number of second RMS values, each indicative of a root mean square of amplitude values in the vibration spectral data having associated frequency values falling between the frequency values associated with the N number of identified spectral peaks;
 calculates a third RMS value indicative of a root mean square of all amplitude values in the vibration spectral data having associated frequency values that are greater than a frequency value of a highest-frequency peak of the N number of identified spectral peaks; and
 generates the compressed vibration spectrum including the first RMS value, the second RMS values, and third RMS value.

In some embodiments, the processor is operable to calculate spectral band energy from the compressed vibration spectrum.

In some embodiments, the processor generates the compressed vibration spectrum including a value indicating a maximum spectral frequency (Fmax) of the vibration spectral data, a value indicating a number of lines of resolution of the vibration spectral data, and a value indicating a frequency step size (bin width) between lines of resolution in the vibration spectral data.

In some embodiments, the processor:
 identifies spectral side values associated with each of the N number of identified spectral peaks, wherein the spectral side values comprise amplitude values that are adjacent in frequency to the frequency values associated with each of the N number of identified spectral peaks; and
 generates the compressed vibration spectrum including the spectral side values.

In some embodiments, the processor is a component of the vibration monitoring device.

In some embodiments, the processor is a component of a server computer that is in communication with the vibration monitoring device via the communication network.

BRIEF DESCRIPTION OF THE DRAWINGS

Other embodiments of the invention will become apparent by reference to the detailed description in conjunction with the figures, wherein elements are not to scale so as to more clearly show the details, wherein like reference numbers indicate like elements throughout the several views, and wherein.

DETAILED DESCRIPTION

Figure 1:
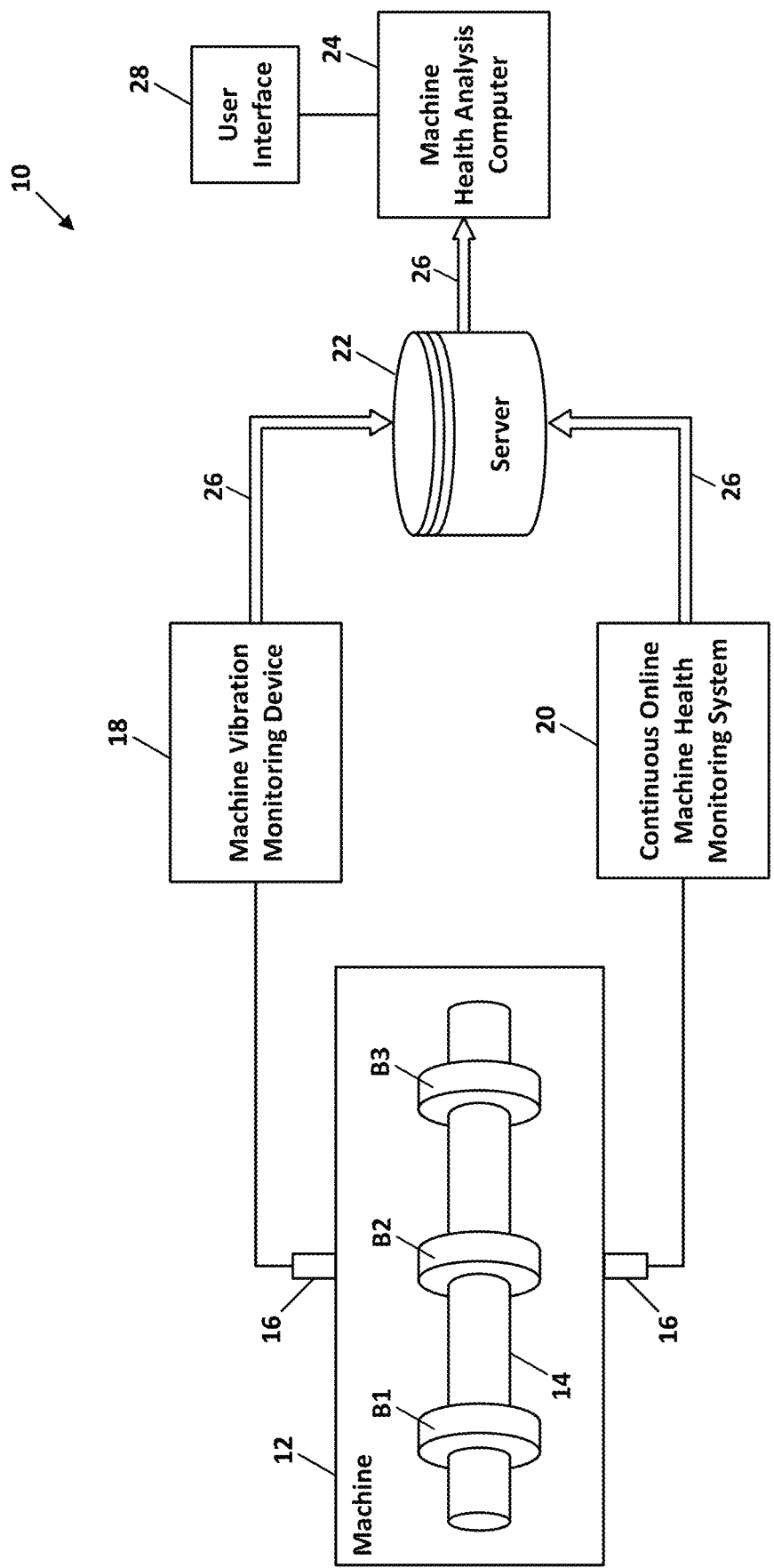
FIG. 1 depicts a machine health data collection and analysis system according to an embodiment of the invention.
Figure 2:
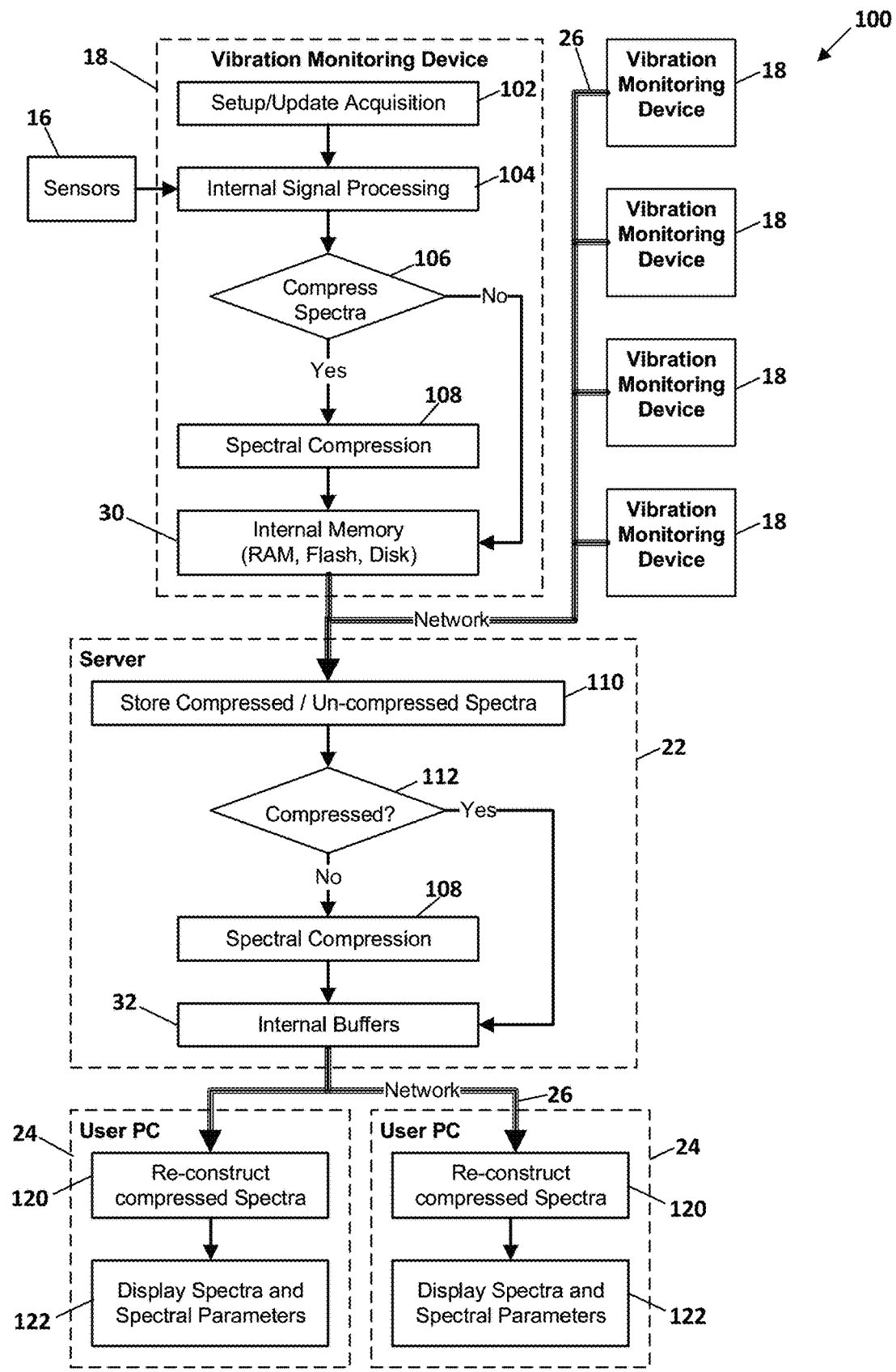
FIGS. 2, 3A, and 3B depict a machine spectral data compression/decompression process according to an embodiment of the invention.
Figure 3A:
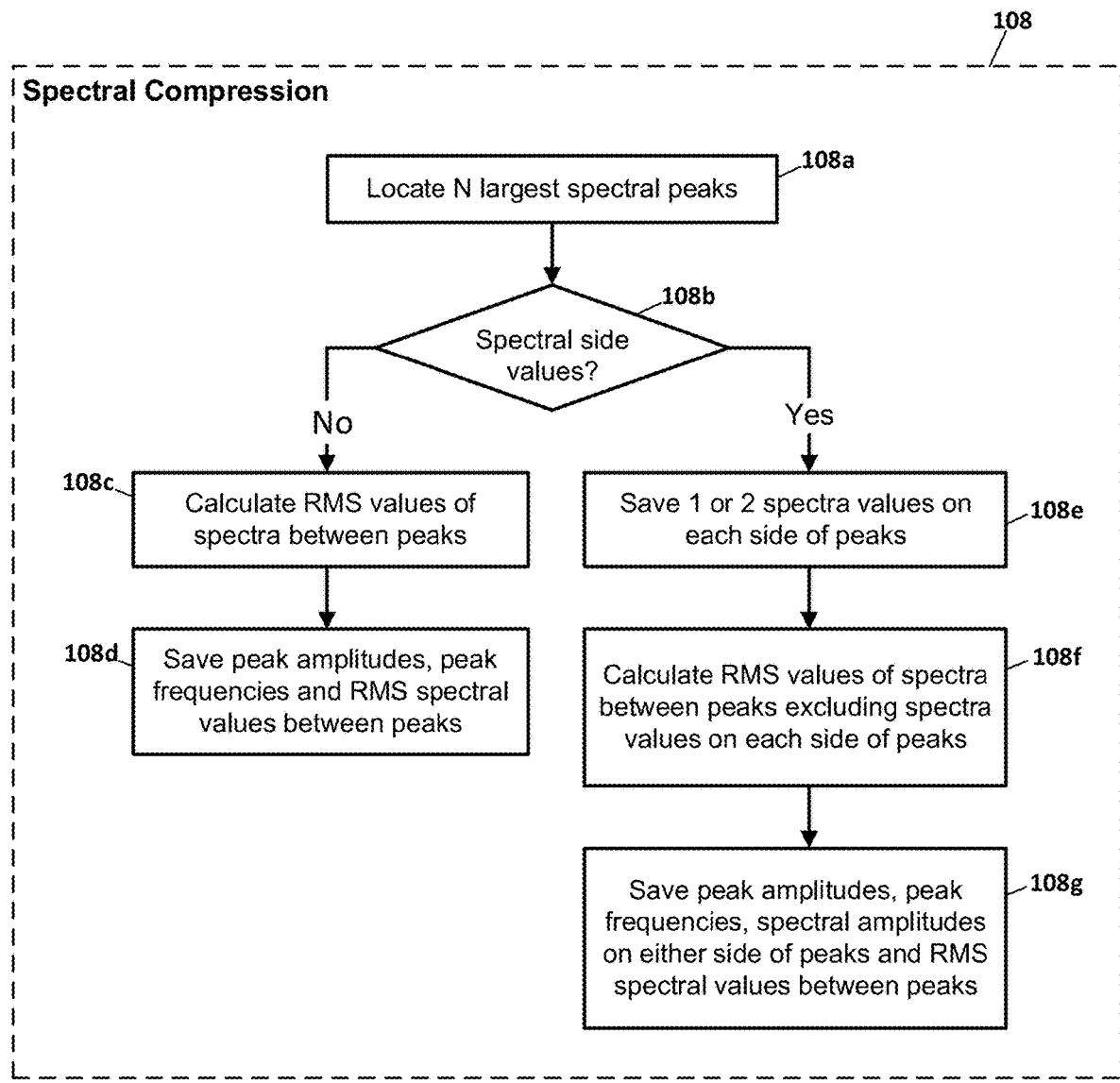
Figure 3B:
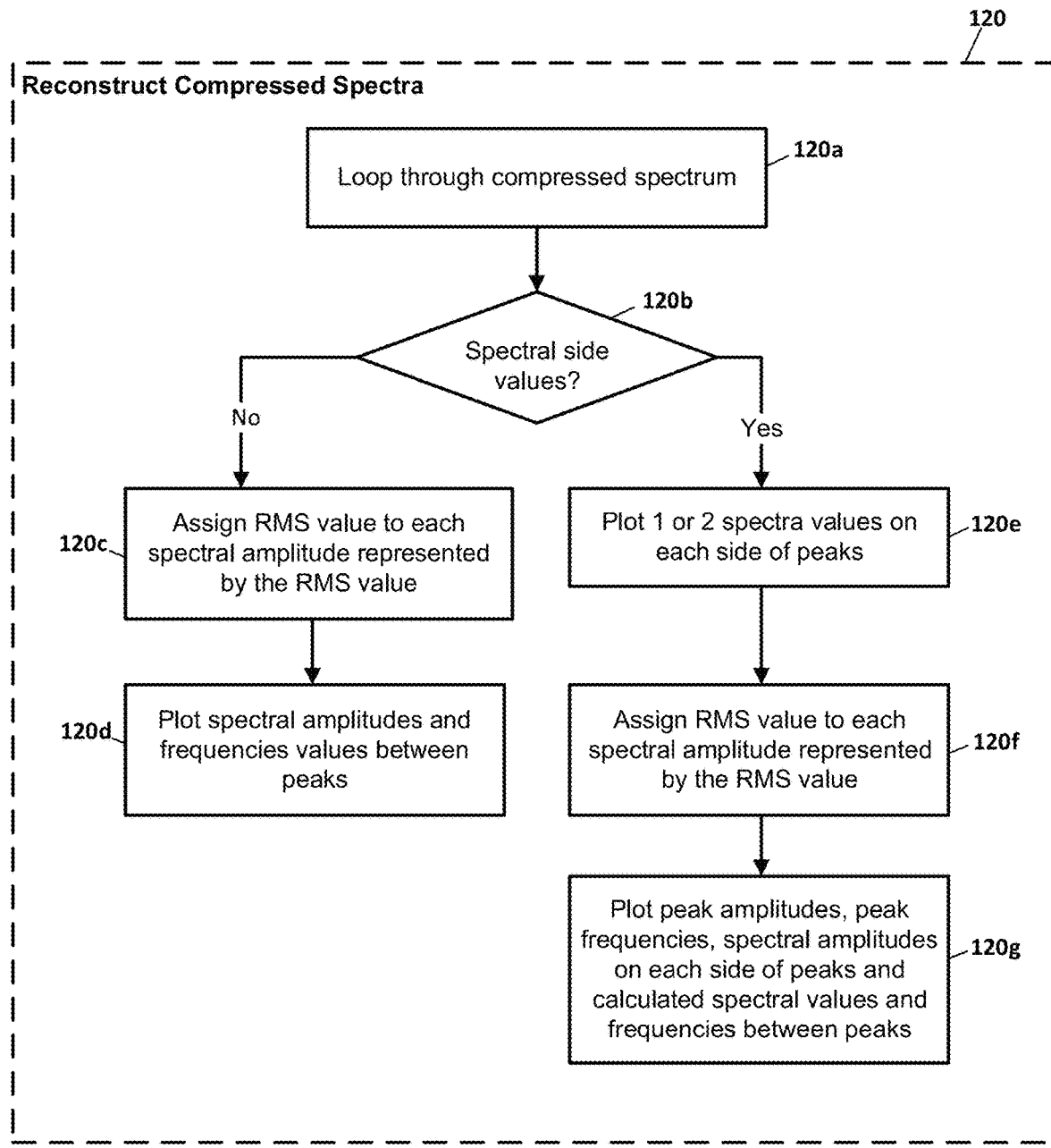

FIG. 1 depicts a machine health measurement and analysis system 10 that includes sensors, such as vibration sensors 16, attached to a machine 12. In other embodiments, parameters indicative of machine health other than vibration may be sensed, such as current or flux. FIGS. 2, 3A, and 3B depict a process performed using the system of FIG. 1 for collecting and compressing machine health data, and displaying the data in graphical spectral plots that allow an operator to easily ascertain the overall health of the machine 12.

As shown in FIG. 1, the machine 12 may include at least one rotating component 14, such as a shaft supported by bearings B1, B2, and B3. The vibration sensors 16 generate vibration signals representative of the vibration of the machine 12, which include vibration components associated with the bearings B1, B2, and B3. In a preferred embodiment, the vibration signals are received, conditioned, and converted to time waveform or spectral digital data by one or more machine health data collectors, such as a wired or wireless machine vibration monitoring device 18 or a continuous online machine health monitoring system 20 (steps 102 and 104 in FIG. 2). In some embodiments, the machine health data collectors 18 and 20 include signal conditioning circuitry and analog-to-digital conversion circuitry for conditioning the vibration signals from the sensors 16 and generating the time waveform digital vibration data based thereon.

In various embodiments, a processor in the machine vibration monitoring device 18, or in the continuous online machine health monitoring system 20, or in the machine health analysis computer 24 enables the performance of the processing steps in the method depicted in FIGS. 2, 3A, and 3B. Based on the measured vibration data, one or more machine health parameters are calculated (step 104). In general, a machine health parameter is any scalar value or other type of value that may be trended to indicate the general health of a machine over time. Examples of machine health parameters include standard vibration, PeakVue, and Periodicity.

The vibration spectral data are preferably downloaded to a machine health server 22 for long term storage. The data on the server 22 is available for analysis by software routines executed on one or more machine health analysis computers 24. Alternatively, the vibration spectral data are stored in data storage devices in the machine vibration monitoring device 18 or the continuous online machine health monitoring system 20. In preferred embodiments, each machine health analysis computer 24 includes a user interface 28, such as a touch screen, that allows a user to view measurement results, select certain measurement parameters, and provide other input as described herein.

Figure 4:
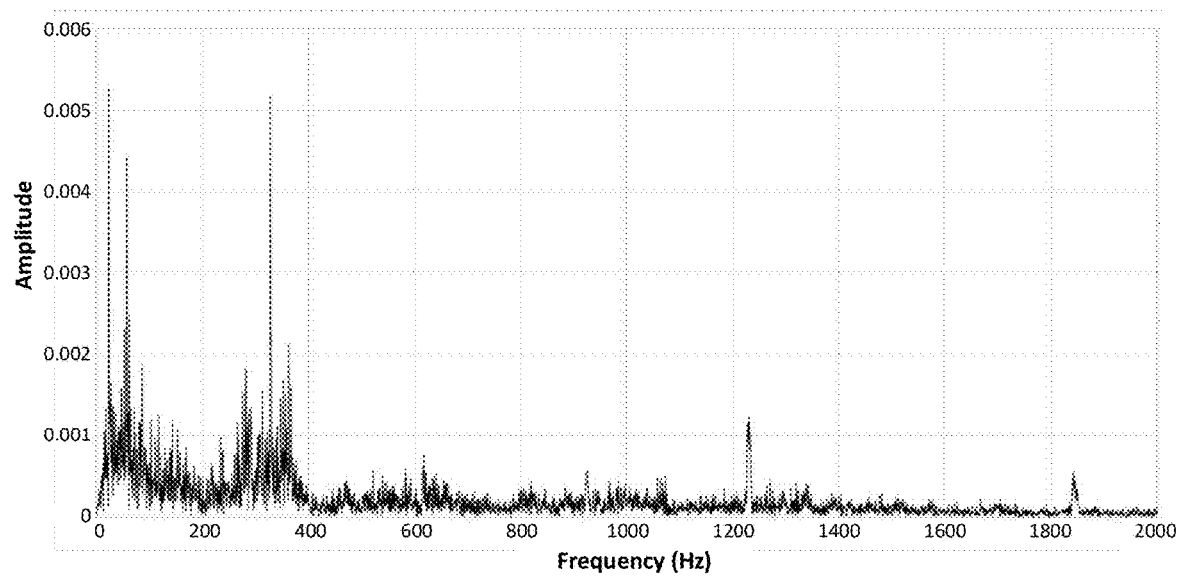
FIG. 4 depicts an example of a full (uncompressed) spectral plot comprising 3200 data points.
Figure 5:
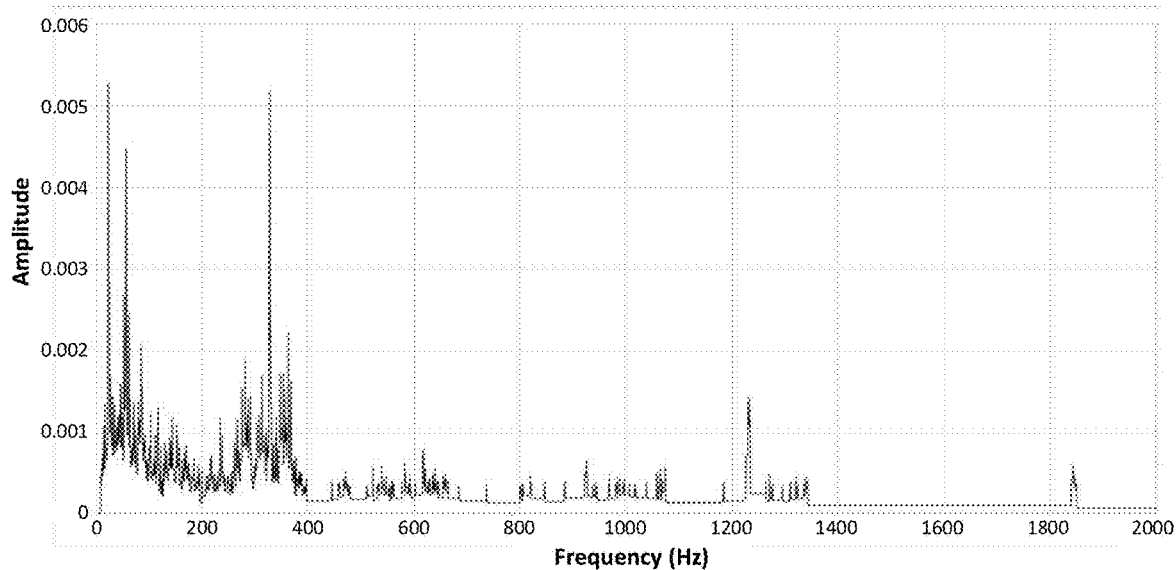
FIG. 5 depicts the spectral data of FIG. 4 compressed down to a plot comprising 300 peak value data points and 301 RMS values—one to either side of each peak—according to an embodiment of the invention.

FIG. 4 depicts an example of a vibration spectral plot in which 3200 amplitude values are plotted. FIG. 5 depicts the same spectral data compressed down to 601 amplitude values. To arrive at the plot of FIG. 5, a preferred embodiment of the compression algorithm identifies the 300 highest-amplitude peaks in the data plotted in FIG. 4 and calculates the root-mean-square (RMS) values of the amplitudes of all data points between each of the 300 identified spectral peaks. RMS values are also calculated for all data points from the lowest frequency data point up to the lowest-frequency identified peak, and for all data points from the highest-frequency identified peak up to the highest frequency data point. In FIG. 5, the horizontal lines between the peaks represent the RMS values.

In some embodiments, one or two amplitude values on each side of each of the identified peaks are also included in the compressed data to be plotted. As discussed in more detail hereinafter, these values—also referred to herein as spectral side values—provide for a more realistic looking plot of the reconstructed compressed spectrum.

In a preferred embodiment, the number of identified peaks is a selectable value that depends on the level of detail required. Fewer peaks reduce the detail and the amount of data to be transmitted over the network 26. Similarly, more peaks increase the detail but also increase the amount of data to be transmitted. In most situations, the 300 highest amplitude peaks are sufficient for machine health analysis.

Plotting the RMS values between the peaks provides a more visually realistic plot that appears more like the full spectral plot shown in FIG. 4. Additionally, the presence of the RMS values in the compressed spectral data allows for the calculation of spectral band energy from the compressed data.

Figure 6:
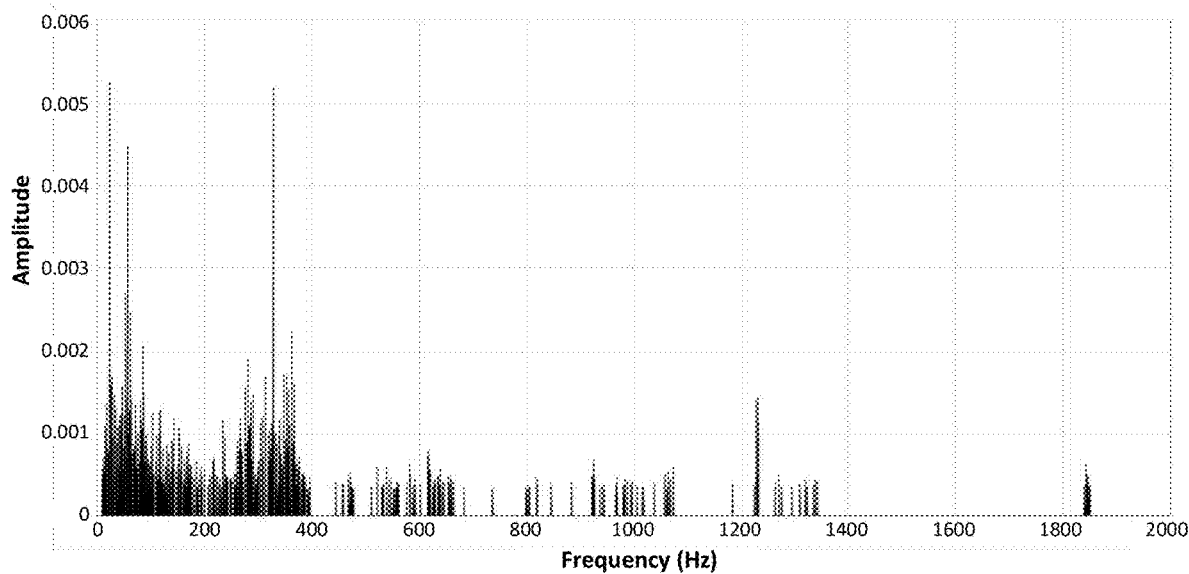
FIG. 6 depicts the spectral data of FIG. 4 compressed down to a plot comprising 600 peak value data points and 601 RMS values—one to either side of each peak—according to an embodiment of the invention.

For comparison purposes, FIG. 6 depicts a plot of the same compressed spectrum as shown in FIG. 5, but without the RMS values included. In FIG. 6, all of the values between the identified peaks are set to zero, which does not provide the appearance of the actual spectrum shown in FIG. 4 in which the lowest amplitudes in the spectra are obviously raised above the X-axis. Thus, the compressed spectrum of FIG. 5 that includes the RMS values looks more like the plot of the uncompressed spectrum shown in FIG. 4.

The level of compression is particularly important in reducing network traffic when transferring high resolution spectra, such as those having 12800 or more lines of resolution. The level of compression is also important for spectral data collected by battery-powered vibration monitoring devices, such as the model AMS 9420, in which the number of identified peaks may be reduced to as few as forty. Thus, compression not only drastically reduces network traffic, but it also decreases battery usage, considering that a substantial amount of battery energy goes into transmitting data over the network.

Figure 7:
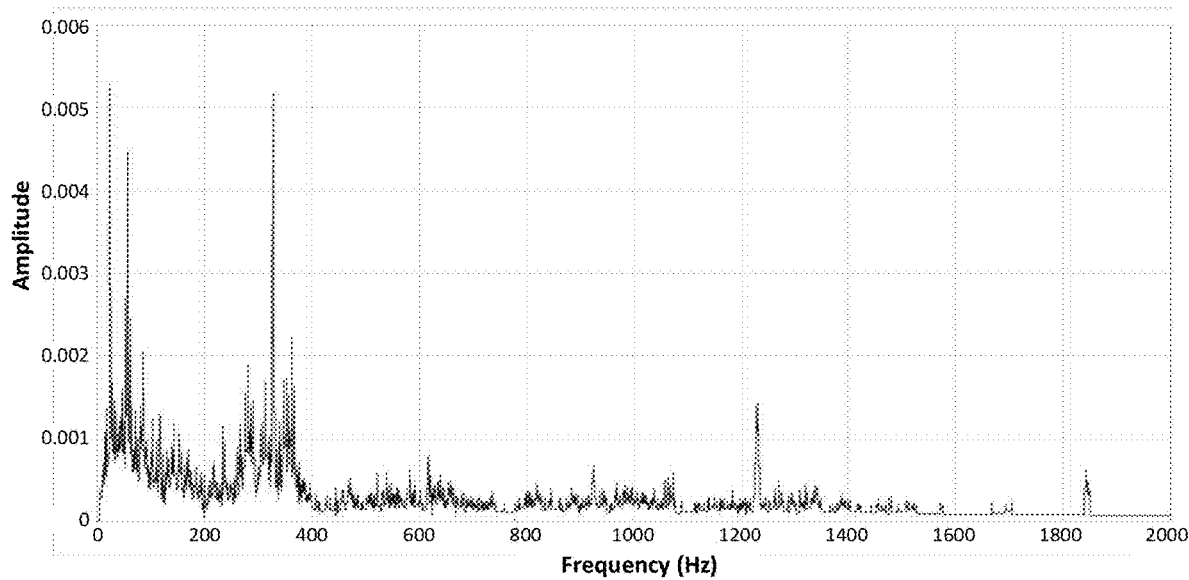
FIG. 7 depicts another example of a full (uncompressed) spectral plot.

The compression ratio of the data depicted in FIG. 5 is $(1-601/3200) \times 100\% = 81.22\%$. FIG. 7 depicts the same spectral data as plotted in FIG. 4, but with the 600 highest amplitude peaks identified and 601 RMS values calculated. Thus, the plot of FIG. 7 is based on 1201 data points, which results in a compression ratio of $(1-1201/3200) \times 100\% = 62.47\%$.

Figure 8:
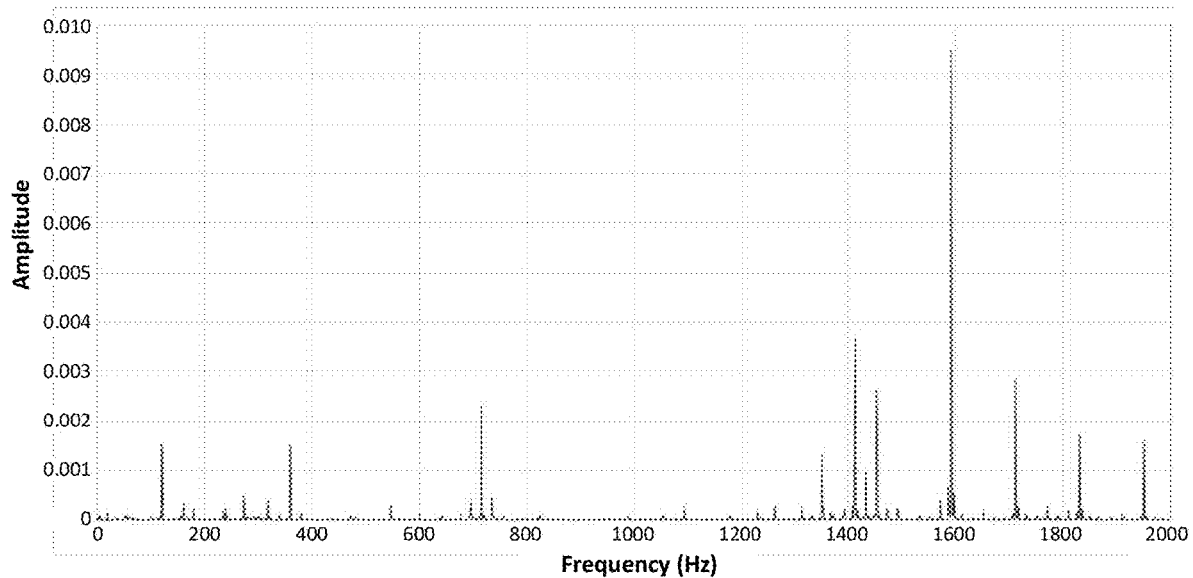
FIG. 8 depicts the spectral data of FIG. 7 compressed down to a plot comprising 300 peak value data points and 301 RMS values—one to either side of each peak—according to an embodiment of the invention.
Figure 9:
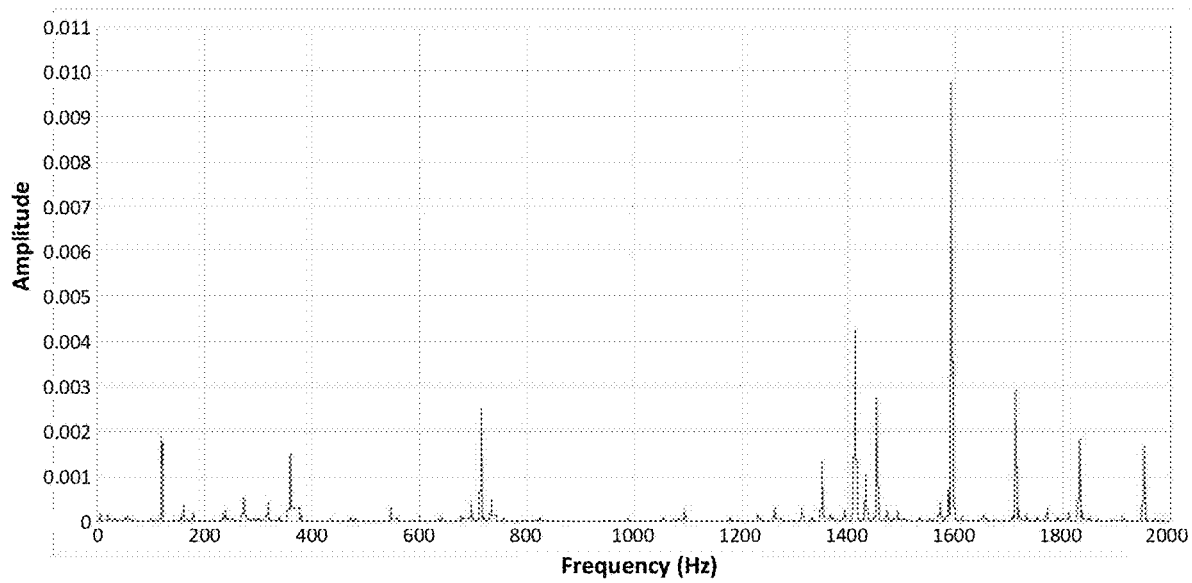
FIG. 9 depicts spectral compression ratios versus number of peaks for four different numbers of total data points for a case in which side spectral values are not preserved on each side of the peaks.

FIG. 8 depicts a second example of an un-compressed spectrum, and FIG. 9 depicts a compressed version of the same spectral data in which the 300 highest peaks are identified and 301 adjacent RMS values are calculated.

As shown in FIG. 2, operation of a preferred embodiment is represented by a flowchart divided generally into three sections: processes performed by the vibration monitoring device 18, processes performed by the central server 22, and processes performed by the individual user computers 24. Communication between these devices is provided by the communication network 26. As described herein, the compression processes provide for a reduction in the amount of data transmitted over the network 26, and a reduction in the capacity of data storage needed on the server 22.

As indicated in FIG. 2, multiple vibration monitoring devices 18 may simultaneously send data to the server 22. These devices 18 may be of various kinds and in various combinations. For example, multiple wireless vibration monitoring devices, such as model AMS 9420 or AMS 9530 devices, may be used in combination with one or more model AMS 6500 online monitoring devices.

The spectral compression process 108 depicted in FIG. 3A could be performed by a processor in the individual vibration monitoring devices 18 or by a processor in the server 22. If the compression is performed in the individual devices 18, each device 18 stores a compressed version of the spectrum in internal memory 30 prior to transmission to the server 22 via the network 26. Otherwise, an uncompressed version of the spectrum is stored in the memory 30 prior to transmission. In either case, the transmitted spectrum is then stored in a database on the server 22 (step 110).

With continued reference to FIG. 2, when a request for a spectrum for analysis or viewing at a user computer 24 is received by the server 22, either the compressed spectrum is transferred to the user computer 24, or the non-compressed spectrum is compressed using the compression algorithm (step 108), stored in internal buffers 32, and then transmitted via the network 26. As compared to transmitting an uncompressed spectrum, transmitting the compressed spectrum may result in a significant reduction in network traffic on the portion of the network 26 linking the server 22 to the user computer 24. This is particularly import for a large network installation that has numerous users, and is particularly important when live data is continuously streamed.

FIG. 3A depicts a preferred embodiment of the spectral compression algorithm 108. Initially, a user-defined N number of the highest amplitude spectral peaks are identified (step 108a). If spectral side values on each side of the peak values are not to be included in the compressed data (step 108b), then the root mean square (RMS) values of the spectral data are calculated (step 108c), which includes the RMS value for data points at frequencies below the lowest-frequency identified peak (also referred to herein as the first RMS value), the RMS values between each of the identified peaks (also referred to as the second RMS values), and the RMS value for data points at frequencies above the highest-frequency identified peak (also referred to as the third RMS value). The amplitudes and frequencies of the identified peaks and the calculated RMS values are stored in internal memory 30 or 32 (step 108d). If spectral side values (one or two values) on each side of the identified peaks are to be included (step 108b), then the spectral side values are identified (108e), the first, second, and third RMS values of the spectral data—excluding side values on each side of the peaks—are calculated (step 108f), and the amplitudes and frequencies of the identified peaks, the amplitudes of the spectral side values, and the RMS values are stored in internal memory 30 or 32 (step 108g).

Inclusion of the RMS values in the compressed data, with or without the spectral side values, enables a more realistic looking plot to be created. In other words, the compressed plot looks more like the full spectral plot. Further, including the RMS values—rather than a simple average value of the spectral data between the identified peaks—enables the calculation of spectral band energy that is more accurate than a simple average would allow, and ensures that the calculation of the total spectral energy is the same for both the un-compressed spectrum and the compressed spectrum.

Including the one or two spectral values on each side of the identified peaks in the compressed data enables a peak location algorithm to more accurately calculate the peak energy and frequency, which is important for vibration analysis.

When a user submits a request from a user computer 24 to view a compressed spectrum, the compressed spectral data is transferred via the network 26 from the server 22 to the user computer 24. For example, if the spectral data does not include spectral side values, the transferred spectral data includes the following values (with number of each value in the case of N=300):

the amplitude of each identified peak (300),
the frequency of each identified peak (300),
the RMS amplitude of all data points at frequencies less than the lowest-frequency identified peak (1),
the RMS amplitudes of data points between each pair of identified peaks (299),
the RMS amplitude of all data points at frequencies greater than the highest-frequency identified peak (1),
the maximum spectral frequency (Fmax) of the original spectrum (1),
the number of lines of resolution of the original spectrum (1), and
the frequency step size (bin width) between lines of resolution in the original spectrum (1).

These data values provide sufficient information for the compressed spectrum to be reconstructed by the processor of the user computer 24 (step 120) for display on the display device of the user computer 24 (step 122). If spectral side values are included, the transferred spectral data also include amplitude values for each of the spectral side values.

FIG. 3B depicts a preferred embodiment of a process for reconstructing a compressed spectrum (step 120). The reconstruction process loops through the compressed spectral data (step 120a) finding the spectral peaks and then the RMS values between the peaks, and systematically recreates the spectral amplitudes for each spectral bin until the maximum spectral frequency (Fmax) is reached. If the compressed spectrum includes spectral side values (120b), the process involves plotting the one or two spectral values on each side of each peak (120e), assigning an RMS value to all spectral amplitudes at frequencies between the outermost side values of the peaks (step 120f), and plotting the assigned RMS values at the appropriate frequencies between the outermost side values of the spectral peaks (step 120g). If the compressed spectrum does not include spectral side values (120b), the process assigns an RMS value to all spectral amplitudes at frequencies between the spectral peaks (step 120c), and plots spectral peaks and the assigned RMS values at the appropriate frequencies between the spectral peaks (step 120d).

Figure 10:
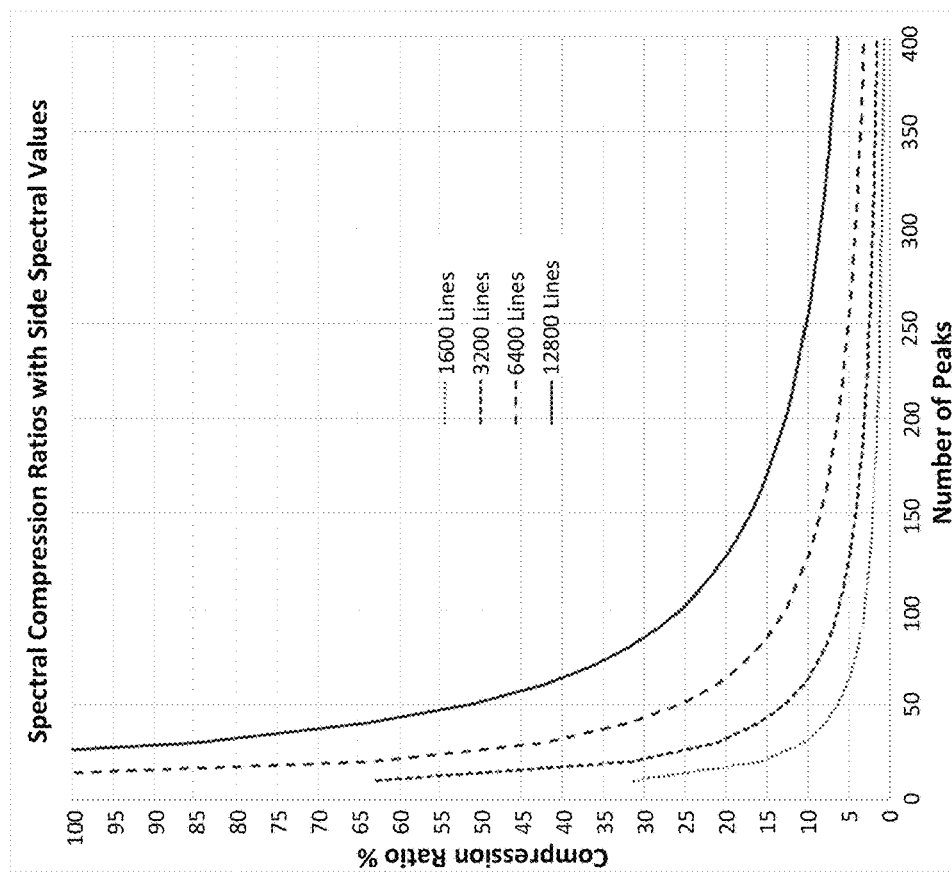
FIG. 10 depicts spectral compression ratios versus number of peaks for four different numbers of total data points for a case in which side spectral values are preserved on each side of the peaks.

Spectral compression ratios versus numbers of identified peaks for several different resolutions of spectral data are plotted in FIG. 10 (without spectral side values) and 11 (with spectral side values). As these plots indicate, the spectral compression ratio is dependent on the number lines in the spectrum and the number of peaks (N) identified—the smaller the number of peaks, the higher the compression ratio.

Figure 11:
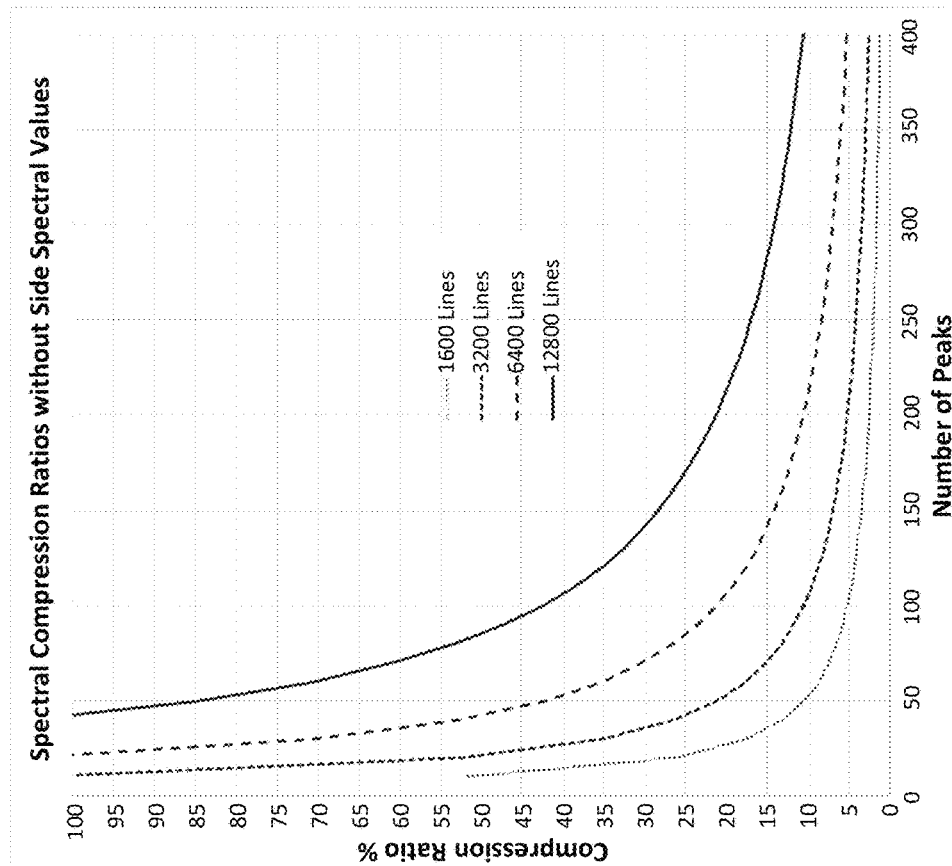
FIG. 11 depicts spectral compression ratios versus number of peaks for four different numbers of total data points for a case in which side spectral values are preserved on each side of the peaks.

Comparing the curves of FIGS. 10 and 11, it is apparent that preserving the spectral values on each side of the peaks reduces the compression ratio to some extent, but it enables accurate determination of the peak amplitude and frequency using a peak location algorithm. If maximum compression is less important than accurate peak location, then accurate peak location is the preferable approach.

The foregoing description of preferred embodiments for this invention have been presented for purposes of illustration and description. They are not intended to be exhaustive or to limit the invention to the precise form disclosed. Obvious modifications or variations are possible in light of the above teachings. The embodiments are chosen and described in an effort to provide the best illustrations of the principles of the invention and its practical application, and to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally, and equitably entitled.

What is claimed is:
1. A computer-implemented method for reducing an amount of machine spectral data to be transmitted over a communication network while maintaining details of spectral peaks used for analysis of the machine spectral data, comprising:

(a) sensing an operational characteristic of a machine and generating an operational characteristic signal using a sensor attached to the machine;

(b) generating machine spectral data based on the operational characteristic signal, the machine spectral data comprising amplitude values and associated frequency values indicative of the operational characteristic of the machine, wherein the machine spectral data are associated with a number of lines of resolution (LOR), each corresponding to one of the amplitude values and associated frequency values;

(c1) identifying N number of spectral peaks in the machine spectral data having amplitude values that are greater than the amplitude values of all spectral peaks not included in the N number of identified spectral peaks;

(c2) calculating a first RMS value indicative of a root mean square of all amplitude values in the machine spectral data having associated frequency values that are less than a frequency value of a lowest-frequency peak of the N number of identified spectral peaks;

(c3) calculating N-1 number of second RMS values, each indicative of a root mean square of amplitude values in the machine spectral data having associated frequency values falling between the frequency values associated with the N number of identified spectral peaks;

(c4) calculating a third RMS value indicative of a root mean square of all amplitude values in the machine spectral data having associated frequency values that are greater than a frequency value of a highest-frequency peak of the N number of identified spectral peaks;

(d) storing a compressed spectral data set comprising:
N number of amplitude values associated with the N number of spectral peaks identified in step (c1);
N number of frequency values associated with the N number of spectral peaks identified in step (c1);
the first RMS value;
the second RMS values; and
the third RMS value,
wherein a number of data points included in the compressed spectral data set is reduced by a compression ratio of at least $$1-(2\times N/LOR)$$

compared to a number of data points included in the machine spectral data; and (e) transferring the compressed spectral data set over the communication network to a machine health analysis computer, wherein the reduced number of data points in the compressed spectral data set reduces an amount of network traffic on the communication network as compared to an amount of network traffic that would be on the communication network if all data points in the machine spectral data were transferred to the machine health analysis computer; and (f) displaying the compressed spectral data set as a spectral plot on a display device of the machine health analysis computer, wherein the spectral plot comprises:
the N number of amplitude values, each plotted at a corresponding one of the N number of frequency values;
the first RMS value plotted as a horizontal line at frequency values less than a frequency value of the lowest of the N number of frequency values;
the second RMS values, each plotted as a horizontal line at frequency values falling between the frequency values associated with the N number of amplitude values; and
the third RMS value plotted as a horizontal line at frequency values greater than a frequency value of the highest of the N number of frequency values.

2. The method of claim 1 further comprising calculating spectral band energy from the compressed spectral data set.

3. The method of claim 1 wherein step (d) further comprises storing the compressed spectral data set including a value indicating a maximum spectral frequency of the machine spectral data, a value indicating the number of lines of resolution of the machine spectral data, and a value indicating a frequency step size between lines of resolution in the machine spectral data.

4. The method of claim 1 further comprising:
identifying spectral side values associated with each of the N number of identified spectral peaks, wherein the spectral side values comprise amplitude values that are adjacent in frequency to the frequency values associated with each of the N number of identified spectral peaks; and
step (d) further comprising storing the compressed spectral data set including the spectral side values.

5. The method of claim 4 wherein:
calculating the first RMS value excludes the spectral side values;
calculating the N-1 number of second RMS values excludes the spectral side values; and
calculating the third RMS value excludes the spectral side values.

6. The method of claim 1 wherein the sensor comprises a vibration sensor, the operational characteristic signal comprises a vibration signal, and the machine spectral data comprises a vibration spectrum.

7. The method of claim 1 wherein step (e) comprises one or more of transferring the compressed spectral data set from a machine health data collector to a server computer and transferring the compressed spectral data set from the server computer to the machine health analysis computer.

8. An apparatus for reducing an amount of machine vibration spectral data to be transmitted over a communication network while maintaining details of spectral peaks used for analysis of the machine vibration spectral data, comprising:
a vibration sensor for sensing vibration of a machine and generating a vibration signal;
a vibration monitoring device that receives the vibration signal and generates vibration spectral data based thereon, the vibration spectral data comprising amplitude values and associated frequency values indicative of the vibration of the machine, wherein the vibration spectral data are associated with a number of lines of resolution (LOR), each corresponding to one of the amplitude values and associated frequency values;
a processor that:
identifies N number of spectral peaks in the vibration spectral data having amplitude values that are greater than the amplitude values of all spectral peaks not included in the N number of identified spectral peaks;
calculates a first RMS value indicative of a root mean square of all amplitude values in the vibration spectral data having associated frequency values that are less than a frequency value of a lowest-frequency peak of the N number of identified spectral peaks;

calculates N-1 number of second RMS values, each indicative of a root mean square of amplitude values in the vibration spectral data having associated frequency values falling between the frequency values associated with the N number of identified spectral peaks;

calculates a third RMS value indicative of a root mean square of all amplitude values in the vibration spectral data having associated frequency values that are greater than a frequency value of a highest-frequency peak of the N number of identified spectral peaks; and generates a compressed vibration spectrum comprising:
N number of amplitude values associated with the N number of spectral peaks;
N number of frequency values associated with the N number of spectral peaks;
the first RMS value;
the second RMS values; and
the third RMS value,
wherein a number of data points included in the compressed vibration spectrum is reduced by a compression ratio of at least $$1-(2 \times N/LOR)$$

compared to a number of data points included in the vibration spectral data; and a communication network for transferring the compressed vibration spectrum to a user computer, wherein the reduced number of data points in the compressed vibration spectrum reduces an amount of network traffic on the communication network as compared to an amount of network traffic that would be on the communication network if all data points in the vibration spectral data were transferred to the user computer; and a display device of the user computer on which the compressed vibration spectrum is displayed as a spectral plot that comprises:
the N number of amplitude values, each plotted at a corresponding one of the N number of frequency values;
the first RMS value plotted as a horizontal line at frequency values less than a frequency value of the lowest of the N number of frequency values;
the second RMS values, each plotted as a horizontal line at frequency values falling between the frequency values associated with the N number of amplitude values; and
the third RMS value plotted as a horizontal line at frequency values greater than a frequency value of the highest of the N number of frequency values.

9. The apparatus of claim 8 wherein the processor is operable to calculate spectral band energy from the compressed vibration spectrum.

10. The apparatus of claim 8 wherein the processor generates the compressed vibration spectrum including a value indicating a maximum spectral frequency of the vibration spectral data, a value indicating the number of lines of resolution of the vibration spectral data, and a value indicating a frequency step size between lines of resolution in the vibration spectral data.

11. The apparatus of claim 8 wherein the processor:
identifies spectral side values associated with each of the N number of identified spectral peaks, wherein the spectral side values comprise amplitude values that are adjacent in frequency to the frequency values associated with each of the N number of identified spectral peaks; and
generates the compressed vibration spectrum including the spectral side values.

12. The apparatus of claim 8 wherein the processor is a component of the vibration monitoring device.

13. The apparatus of claim 8 wherein the processor is a component of a server computer that is in communication with the vibration monitoring device via the communication network.

14. A computer-implemented method for reducing an amount of machine spectral data to be transmitted over a communication network while maintaining details of spectral peaks used for analysis of the machine spectral data, comprising:
(a) sensing an operational characteristic of a machine and generating an operational characteristic signal using a sensor attached to the machine;
(b) generating machine spectral data based on the operational characteristic signal, the machine spectral data comprising amplitude values and associated frequency values indicative of the operational characteristic of the machine, wherein the machine spectral data are associated with a number of lines of resolution (LOR), each corresponding to one of the amplitude values and associated frequency values;
(c1) identifying N number of spectral peaks in the machine spectral data having amplitude values that are greater than the amplitude values of all spectral peaks not included in the N number of identified spectral peaks;
(c2) identifying spectral side values associated with each of the N number of identified spectral peaks, wherein the spectral side values comprise amplitude values that are adjacent in frequency to the frequency values associated with each of the N number of identified spectral peaks;
(c3) calculating a first RMS value indicative of a root mean square of all amplitude values in the machine spectral data having associated frequency values that are less than a frequency value of a lowest-frequency peak of the N number of identified spectral peaks, excluding the spectral side values;
(c4) calculating N-1 number of second RMS values, each indicative of a root mean square of amplitude values in the machine spectral data having associated frequency values falling between the frequency values associated with the N number of identified spectral peaks, excluding the spectral side values;
(c5) calculating a third RMS value indicative of a root mean square of all amplitude values in the machine spectral data having associated frequency values that are greater than a frequency value of a highest-frequency peak of the N number of identified spectral peaks, excluding the spectral side values; and
(d) storing a compressed spectral data set comprising:
N number of amplitude values associated with the N number of spectral peaks identified in step (c1);
N number of frequency values associated with the N number of spectral peaks identified in step (c1);
the spectral side values;
the first RMS value;
the second RMS values; and
the third RMS value, wherein a number of data points included in the compressed spectral data set is reduced by a compression ratio of at least $$1-(4 \times N/LOR)$$

compared to a number of data points included in the machine spectral data; and (e) transferring the compressed spectral data set over the communication network to a user computer, wherein the reduced number of data points in the compressed spectral data set reduces an amount of network traffic on the communication network as compared to an amount of network traffic that would be on the communication network if all data points in the machine spectral data were transferred to the user computer; and (f) displaying the compressed spectral data set as a spectral plot on a display device of the user computer, wherein the spectral plot comprises:
- the N number of amplitude values, each plotted at a corresponding one of the N number of frequency values;
- the spectral side values plotted on either side of the N number of amplitude values;
- the first RMS value plotted as a horizontal line at frequency values less than a frequency value of the lowest of the N number of frequency values;
- the second RMS values, each plotted as a horizontal line at frequency values falling between the frequency values associated with the N number of amplitude values; and
- the third RMS value plotted as a horizontal line at frequency values greater than a frequency value of the highest of the N number of frequency values.

15. The method of claim 14 further comprising calculating spectral band energy from the compressed spectral data set.

16. The method of claim 14 wherein step (d) further comprises storing the compressed spectral data set including a value indicating a maximum spectral frequency of the machine spectral data, a value indicating the number of lines of resolution of the machine spectral data, and a value indicating a frequency step size between lines of resolution in the machine spectral data.

17. The method of claim 14 wherein the sensor comprises a vibration sensor, the operational characteristic signal comprises a vibration signal, and the machine spectral data comprises a vibration spectrum.

18. The method of claim 14 wherein step (e) comprises one or more of transferring the compressed spectral data set from a machine health data collector to a server computer and transferring the compressed spectral data set from the server computer to the machine health analysis computer.

* * * * *